United States Patent
Lin et al.

(10) Patent No.: US 6,595,370 B2
(45) Date of Patent: Jul. 22, 2003

(54) APPARATUS AND METHOD FOR REDUCING CONTAMINATION IN A WAFER TRANSFER CHAMBER

(75) Inventors: Mu-Tsang Lin, Ho-May (TW); Yu-Lun Lin, Hsin-Chu (TW); Yao-Fey Chuang, Chia-Yih (TW)

(73) Assignee: Taiwan Semiconductor Manufacturing Co., Ltd, Hsin Chu (TW)

( * ) Notice: Subject to any disclaimer, the term of this patent is extended or adjusted under 35 U.S.C. 154(b) by 90 days.

(21) Appl. No.: 09/727,284

(22) Filed: Nov. 29, 2000

(65) Prior Publication Data

US 2002/0063084 A1 May 30, 2002

(51) Int. Cl.[7] .............................. B07B 1/00; C23C 16/00
(52) U.S. Cl. ........................ 209/235; 209/643; 118/719; 414/217
(58) Field of Search ............................ 209/21, 22, 235, 209/643; 118/719, 723 VE; 414/217

(56) References Cited

U.S. PATENT DOCUMENTS

| 4,709,655 A | * | 12/1987 | Van Mastrigt ............... 118/719 |
| 5,223,001 A | * | 6/1993 | Saeki ..................... 414/217 X |
| 5,280,983 A | * | 1/1994 | Maydan et al. .......... 414/217 X |
| 5,997,588 A | * | 12/1999 | Goodwin et al. ........... 29/25.01 |

* cited by examiner

Primary Examiner—Tuan N. Nguyen
(74) Attorney, Agent, or Firm—Tung & Associates

(57) ABSTRACT

A wafer transfer chamber, such as a load-lock chamber used in a cluster processing tool for semiconductor devices that has reduced particle contamination problem is provided. In the wafer transfer chamber, a particle filter is provided to shield or isolate a wafer cassette during a chamber pumping and venting process such that not only particle contamination on the wafers situated in the wafer cassette can be drastically reduced, but also the cycle time or time for pumping and venting the load-lock chamber can be significantly reduced since turbulent flow in the chamber interior can be tolerated when the wafers are isolated from such flow which carries contaminating particles.

20 Claims, 3 Drawing Sheets

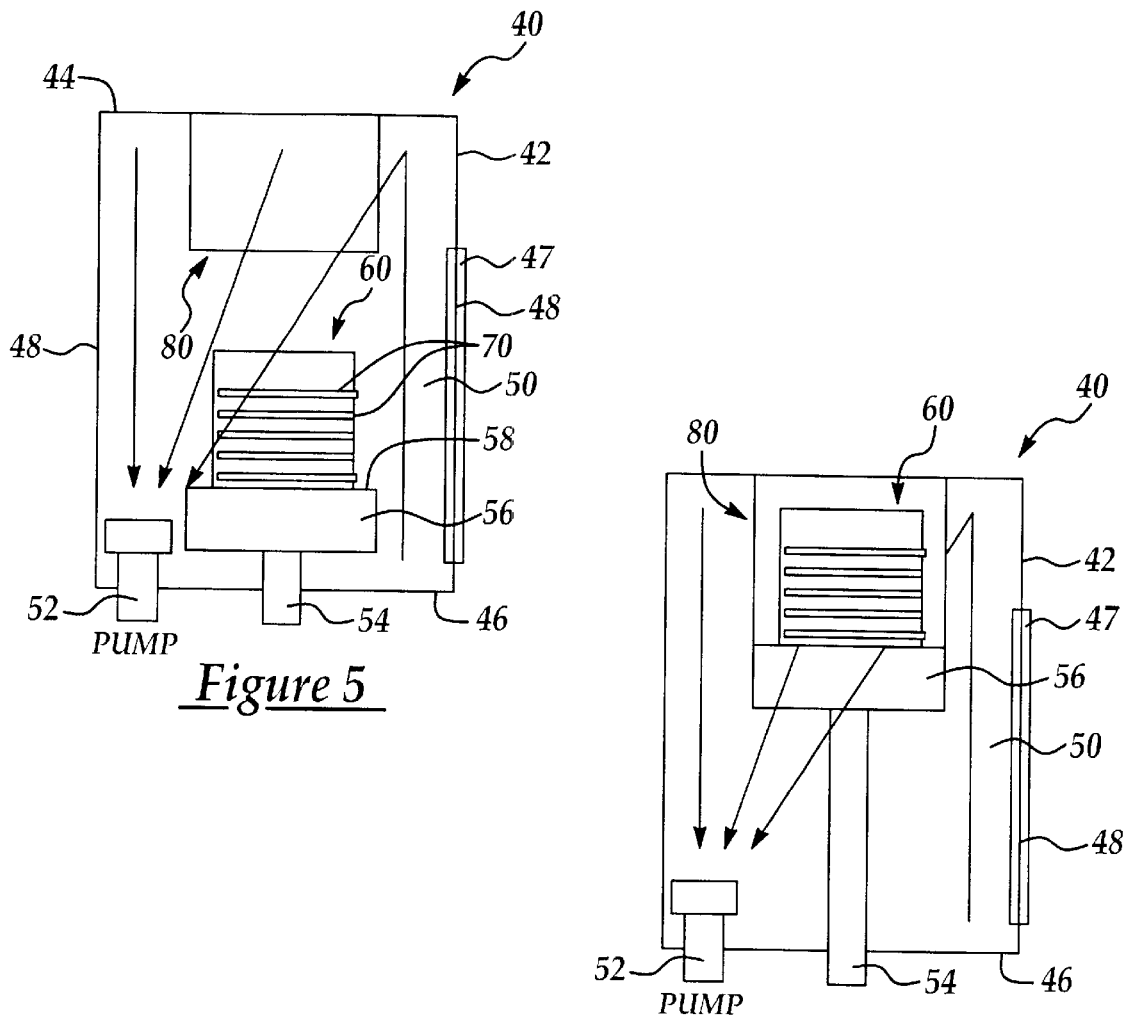
Figure 5
Figure 6
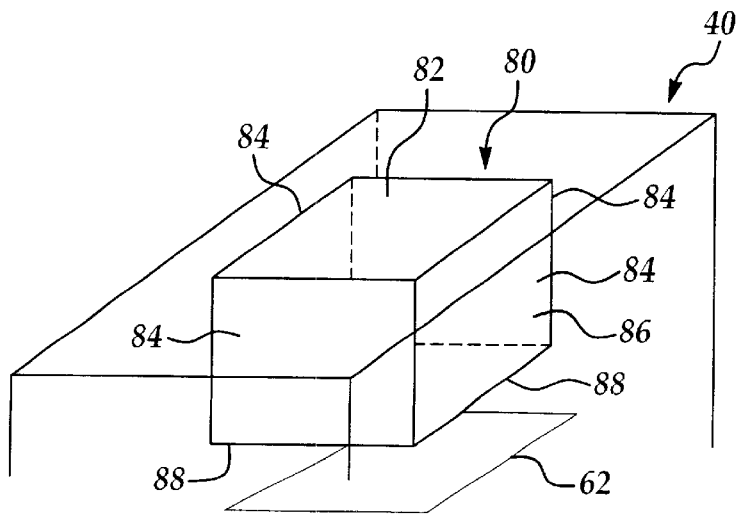
Figure 7

APPARATUS AND METHOD FOR REDUCING CONTAMINATION IN A WAFER TRANSFER CHAMBER

FIELD OF THE INVENTION

The present invention generally relates to a wafer transfer chamber for use in a semiconductor processing apparatus and more particularly, relates to a wafer transfer chamber for a semiconductor process machine that can be operated with reduced particle contamination by utilizing a particle filter for isolating wafers in the transfer chamber and a method for operating the wafer transfer chamber equipped with such particle filter.

BACKGROUND OF THE INVENTION

In the fabrication process for a semiconductor device, numerous processing steps must be performed on a semi-conducting substrate to form various circuits. The process may consist of as many as several hundred processing steps. Each processing step is executed in a process chamber such as an etcher, a physical vapor deposition chamber (PVD), a chemical vapor deposition chamber, etc.

In the vast majority of the processing steps, a special environment of either a high vacuum, a low vacuum, a gas plasma or other chemical environment must be provided for the process. For instance, in a PVD (or sputter) chamber, a high vacuum environment must first be provided that surrounds the wafer such that particles sputtered from a metal target can travel to and deposit on an exposed surface of the wafer. In other process chambers, such as in a plasma enhanced chemical vapor deposition chamber (PECVD), a plasma cloud of a reactant gas or gases is formed over a wafer positioned in a chamber such that deposition of a chemical substance can occur on the wafer. During any processing step, the wafer must also be kept in an extremely clean environment without the danger of being contaminated. The processing of a wafer therefore is normally conducted in a hermetically sealed environment that is completely isolated from the atmosphere. Numerous processing equipment has been provided for such purpose. One of such widely used cluster-type fabrication equipment is marketed by the Applied Materials Corporation of Santa Clara, Calif., i.e., the Centura® 5000 system.

In a typical Centura® 5000 cluster-type wafer handling system, as shown in FIG. 1, the basic system 10 consists of two independent vacuum cassette load-locks 12 and 14, a capacity for one to four independent process chambers (two of such chambers 16 and 18 are shown in FIG. 1), a capacity for two service chambers which includes an orienter 22, and a vacuum transfer chamber 20 which is isolated from vacuum cassette load-locks 12,14 and process chambers 16,18 by slit valves (not shown). The modular design of the basic system 10 is such that up to three high-temperature deposition chambers may be installed in the system. The basic system 10 can be used for fully automatic high-throughput processing of wafers by utilizing a magnetically coupled robot. The basic system 10 is further capable of transferring wafers which are maintained at a temperature as high as 700° C. The basic system 10 also allows cross-chamber pressure equalization and through-the-wall factory installation. The vacuum pumps for the process chambers 16,18, the transfer chamber 20 and the cassette load-locks 12,14 are mounted at a remote location to prevent mechanical vibration from affecting the operation of the system.

The vacuum cassette load-locks 12,14, the process chambers 16,18 and the orienter 22 are bolted to the vacuum transfer chamber 20 and are self-aligned for ease of expansion or modification. Each of the process chambers 16,18 is capable of processing a single wafer for achieving wafer-to-wafer repeatability and control. The temperatures in the process chambers 16,18 are controlled in a closed-loop circuit for accuracy.

A plane view of the basic system 10 of FIG. 1 is shown in FIG. 2. In the basic wafer processing system 10 shown in FIGS. 1 and 2, the transporting of wafers between the various load-lock chambers 12,14, the process chambers 16,18 and the orienter 22 must be carefully conducted to avoid damages from occurring to the wafers. To accomplish such task, the wafer is transported by a wafer transfer system 24. The wafer transfer system 24 consists mainly of a robotic handler which handles all wafer transfers by a single, planar, two-axis, random access, cassette-to-cassette motion. A magnetically coupled robot permits good vacuum integrity and service without interrupting chamber integrity. The major component of the wafer transfer system 24 is a robot blade 28. The robot blade 28 permits high-temperature transfer of wafers without incurring contamination. A non-contact optical wafer centering process is also performed during the wafer transfer process. A constant flow of filtered inert gas such as nitrogen is used in the cassette load-locks 12,14 and the vacuum transfer chamber 20. A conventional robot blade 28 can be fabricated of a non-magnetic type metal such as aluminum.

One of the process chambers 16,18 is frequently used as an etch chamber for performing an etching process on a wafer. For instance, when he formation of alignment marks on the surface of a wafer is necessary, an etching process utilizing a corrosive gas is used for etching the marks (or holes) in the wafer surface. The surface layer etched may be a polysilicon layer. After the completion of the etching process, the robot lade 28 transfers the etched wafer from the etch chamber back into one of the load-lock chambers 12,14. When such direct transfer of wafers between an etch chamber and a load-lock chamber occurs, contaminating particles are were left on the surface of the wafer is carried into the load-lock chamber. While the number of contaminating particles left on a single wafer surface does not present a serious problem to load-lock chamber, the total number of particles carried on as many as 25 wafers stored in a wafer cassette situated in the load-lock chamber produces a cumulative effect an causes a serious contaminating problem.

FIGS. 3 and 4 are lane views and cross-sectional view of a load-lock chamber that has a different design when compared to the load-lock chamber of FIGS. 1 and 2. The different configuration of the load-lock chamber 30 which, similar to the load-lock chamber of FIG. 1, is equipped with a wafer cassette elevator 32. However, the wafer cassette elevator 32 is situated in load-lock chamber 30 which is part of the vacuum transfer chamber 20. The operation of the load-lock chamber 30 is similar to that shown previously. For instance, a wafer is first transferred from the load-lock chambers 12,14 to a wafer orienter 22 (not shown in FIG. 3) to locate the wafer flat side an the wafer center. The wafer is then transferred to a process chamber to carry out a process such as etching, physical vapor deposition or chemical vapor deposition. After the process is completed, the wafer may be transferred to a cool-down chamber for cooling if the process is conducted at a high temperature, otherwise, the wafer is transferred back into the load-lock chamber, i.e. into the wafer cassette. After all the wafers are processed, the wafer cassette elevator is lowered to its unload position and the chamber is vented to atmospheric pressure.

The venting of the chamber is conducted similar to the pumping process for the chamber with the wafer cassette situated on a platform of the elevator positioned in a lowermost position. During the pumping process for the load-lock chamber, as shown in FIG. 4, the process is carried out slowly, i.e. for a time duration of about 5 min. in order to avoid the creation of turbulent flow inside the load-lock chamber. This is to avoid the loosening of contaminating particles that may have attached to the chamber interior components from falling on the wafers. Similarly, during the venting process of the chamber interior, the venting must also be carried out slowly, i.e. for a time duration of about 5 min., in order to avoid turbulent flow in the chamber interior and the further distribution of contaminating particles on the wafer surfaces. Since the total volume of the chamber interior of a load-lock chamber is large when compared to the total volume of a wafer cassette, it is difficult to always maintain cleanliness of the chamber interior to avoid such contamination. The particle contamination problem exists even though the chamber interior is wet cleaned in approximately every two days. It is therefore desirable to provide an apparatus and a method for preventing particle contamination on wafers during either a pumping or a venting process of a load-lock chamber interior.

It is therefore an object of the present invention to provide a wafer transfer chamber such as a load-lock chamber that does not have the drawbacks or the shortcomings of the conventional wafer transfer chamber.

It is another object of the present invention to provide a wafer transfer chamber that has a reduced particle contamination problem.

It is a further object of the present invention to provide a wafer transfer chamber that has a reduced particle contamination problem during a pumping or venting process of the chamber interior.

It is another further object of the present invention to provide a wafer transfer chamber that has a reduced particle contamination problem by utilizing a particle filter in the chamber interior.

It is still another object of the present invention to provide a wafer transfer chamber that has a reduced particle contamination problem equipped with a particle filter for enclosing a wafer cassette during pumping or venting of the chamber interior.

It is yet another object of the present invention to provide a wafer transfer chamber that has a reduced particle contamination problem by utilizing a particle filter inside the chamber which is capable of filtering out any particles larger than 0.125 µm diameter.

It is still another further object of the present invention to provide a method for preventing particle contamination in a wafer transfer chamber by positioning a wafer cassette inside a particle filter during a pumping or venting process for the chamber interior.

It is yet another further object of the present invention to provide a method for reducing particle contamination in a wafer transfer chamber by raising a cassette elevator to an uppermost position such that a wafer cassette is enclosed by a particle filter by engaging a top surface of a platform of the elevator to the particle filter during a pumping or venting process of the chamber interior.

SUMMARY OF THE INVENTION

In accordance with the present invention, a wafer transfer chamber that has reduced particle contamination problem and a method for pumping or venting a wafer transfer chamber with reduced particle contamination are provided.

In a preferred embodiment, a wafer transfer chamber that has reduced particle contamination problem can be provided which includes a chamber enclosure that has a top wall, a bottom wall and four sidewalls forming a vacuum tight cavity therein; a pumping means for evacuating the cavity to a pressure smaller than atmospheric pressure; a venting means for venting the cavity to atmospheric pressure; an elevator means that has a platform for holding a wafer cassette thereon and for moving upwardly or downwardly into a pumping/venting or unloading position, respectively; and a particle filter means that has a top panel and four side panels fabricated of a material capable of filtering out particles, the top panel being stationarily fastened to an interior surface of the top wall of the chamber enclosure while the four side panels forms an enclosure sealingly engaging a top surface of the platform when the platform is raised to an uppermost position by the elevator means during either a pumping or a venting operation.

In the wafer transfer chamber that has reduced particle contamination problem, the wafer transfer chamber may be a load-lock chamber for a semiconductor processing tool. The chamber may further include a pumping means for evacuating the cavity to a pressure lower than 100 mTorr, or an access door through one of the four sidewalls for transporting into/out of the chamber enclosure a wafer cassette. The particle filter means may have a top panel and four side panels fabricated of a material capable of filtering out particles larger than 0.25 µm diameter, or preferably particles larger than 0.125 µm diameter. The platform may further include a gasket member positioned on top and along a peripheral edge for sealingly engaging a bottom end of the four side panels of the particle filter means. The top panel and the four side panels of the particle filter means may be formed of a material fabricated of polymeric fibers.

The present invention is further directed to a method for preventing particle contamination in a wafer transfer chamber that can be carried out by the operating steps of providing a chamber enclosure that has a top wall, a bottom wall and four sidewalls forming a vacuum tight cavity therein, a pumping and a venting means for evacuating and venting the chamber cavity, an elevator means for holding a wafer cassette thereon and for moving upwardly or downwardly into a pumping/venting or unloading position, and a particle filter means that has a top panel and four side panels fabricated of a material capable of filtering out particles wherein the top panel is stationarily fastened to an interior surface of the top wall of the chamber enclosure; positioning a wafer cassette on a platform of the elevator means while the elevator means is positioned at a lowermost position and the chamber cavity at atmospheric pressure; elevating the elevator means to an uppermost position such that a top surface of the platform sealingly engages a bottom surface of the four side panels with the wafer cassette enclosed by the particle filter means; pumping the chamber cavity to a pressure smaller than atmospheric pressure; transferring wafers from the wafer cassette into process chamber by a wafer transfer robot until all wafers are processed; venting the chamber cavity to atmospheric pressure with the elevator means in the uppermost position and the wafer cassette enclosed in the particle filter means; and lowering the elevator means to a lowermost position for unloading the wafer cassette.

The method for reducing particle contamination in a wafer transfer chamber may further include the step of pumping the chamber cavity to a pressure lower than 100 mTorr. The method may further include the step of filtering out particles that have a diameter larger than 0.2 μm by the particle filter means when the wafer cassette is enclosed by the particle filter means during the pumping step and the venting step, or the step of filtering out particles that have a diameter larger than 0.125 μm by the particle filter means. The method may further include the step of mounting the wafer transfer chamber to a semiconductor cluster tool. The method may further include the step of transporting a wafer cassette into the chamber cavity through an access door provided in one of the four sidewalls of the chamber enclosure. The method may further include the step of fabricating the particle filter means with a material formed of polymeric fibers. The method may further include the step of transporting out of the chamber enclosure a wafer cassette after all wafers have been processed through an access door in one of the four sidewalls of the chamber enclosure.

The method for reducing particle contamination in a wafer transfer chamber may further include the step of providing a gasket member on a top surface of the platform for sealingly engaging a bottom surface of the four side panels of the particle filter means when the elevator means is moved into an uppermost position engaging the particle filter means. The method may further include the step of mounting the pumping means for evacuating the cavity through a bottom wall of the chamber enclosure, or the step of pumping the chamber cavity by the pumping means for a time period of at least 3 min., or the step of venting the chamber cavity to atmospheric pressure for a time period of at least 3 min.

BRIEF DESCRIPTION OF THE DRAWINGS

These and other objects, features and advantages of the present invention will become apparent from the following detailed description and the appended drawings in which:

FIG. 5 is a cross-sectional view of a present invention load-lock chamber equipped with a particle filter means.

FIG. 6 is a cross-sectional view of a present invention load-lock chamber equipped with a particle filter means enclosing a wafer cassette when the cassette elevator is moved to its uppermost position.

FIG. 7 is a perspective view of the present invention particle filter means mounted in a load-lock chamber.

DETAILED DESCRIPTION OF THE PREFERRED EMBODIMENT

Figure 1:
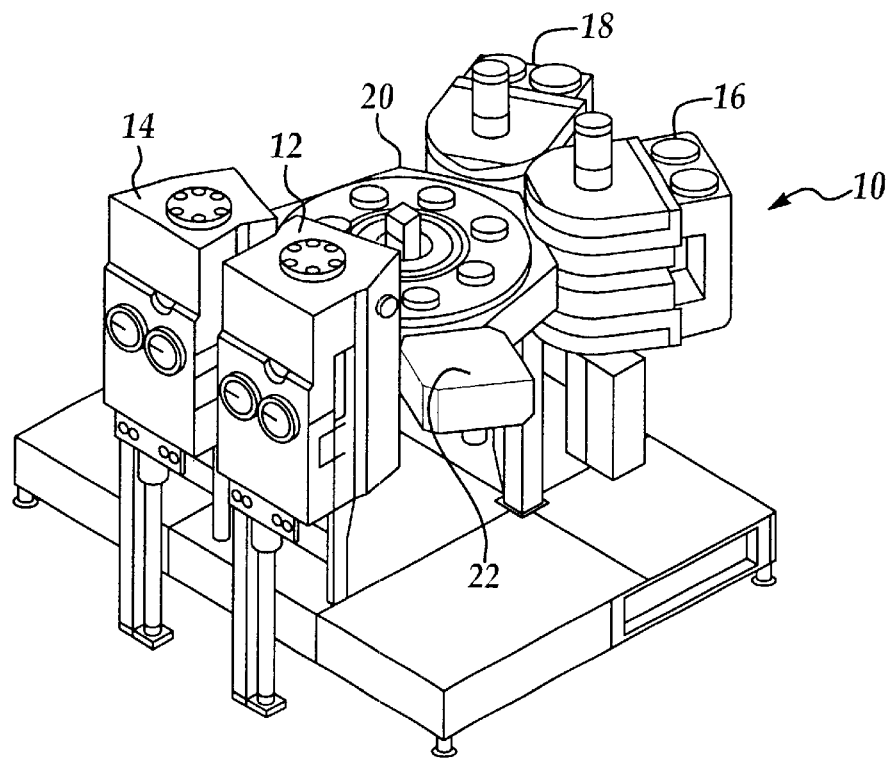
FIG. 1 is a perspective view of a conventional cluster-type wafer fabrication system.
Figure 2:
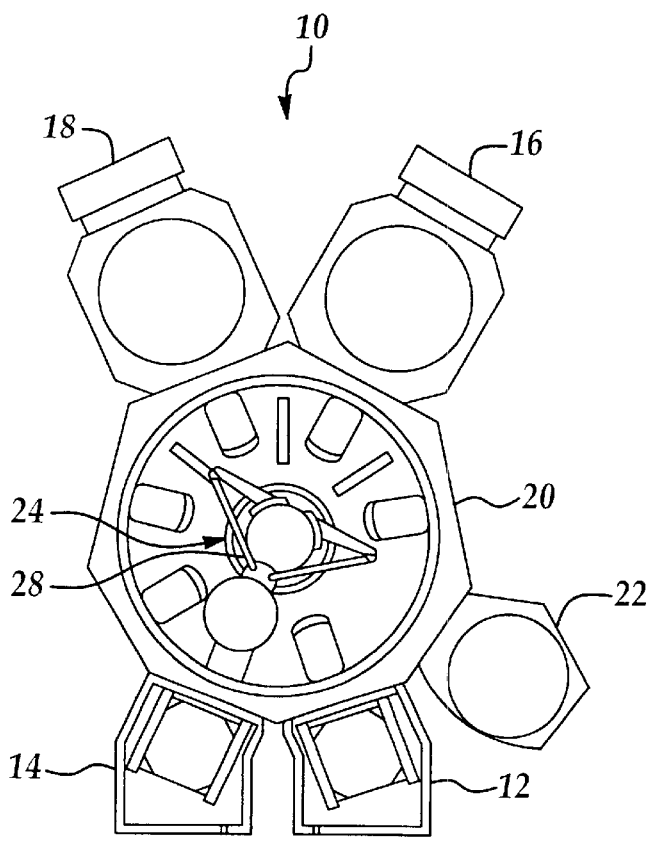
FIG. 2 is a plane view of the conventional cluster-type wafer fabrication system of FIG. 1.
Figure 3:
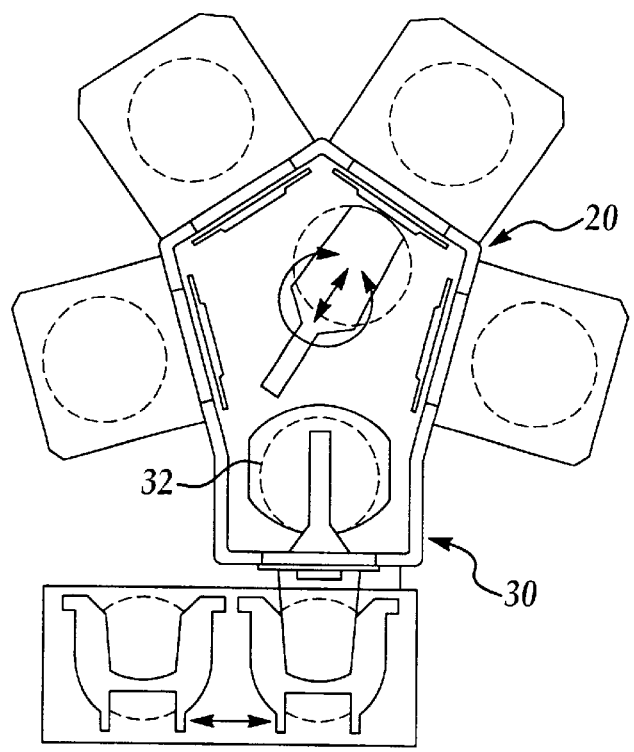
FIG. 3 is a plane view of another conventional cluster-type wafer fabrication system having a different configuration of the load-lock chamber.
Figure 4:
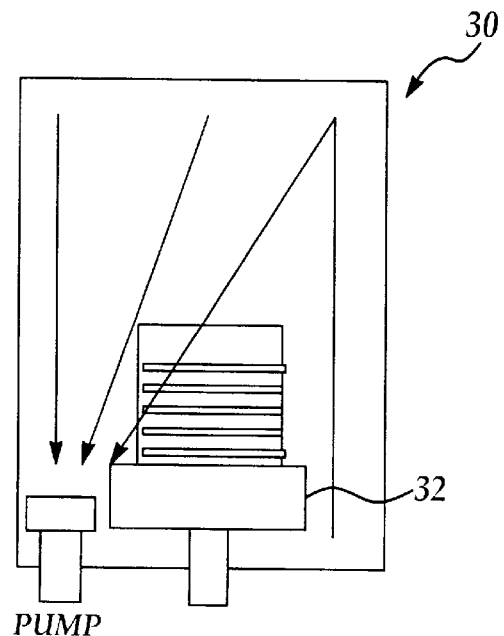
FIG. 4 is a cross-sectional view of a load-lock chamber illustrating a wafer cassette positioned on a cassette elevator.

The present invention discloses a wafer transfer chamber that has reduced particle contamination problem and a method for utilizing such chamber. While the present invention wafer transfer chamber can be used for any type of wafer transfer, it is particularly suited for use in a load-lock chamber for a semiconductor processing cluster tool.

The wafer transfer chamber of the present invention that has reduced particle contamination problem is constructed with a particle filter inside the chamber and is stationarily fastened to a top wall of the chamber. The particle filter is fabricated of a polymeric fiber material that is capable of filtering out particles having diameters larger than 0.2 μm, or preferably a material that is capable of filtering out particles having diameters larger than 0.125 μm. The particle filter is utilized by raising a cassette elevator onto which a wafer cassette is positioned to its uppermost position such that a top surface of the platform sealingly engages a bottom surface of the particle filter to enclose the wafer cassette therein. The wafer cassette is therefore completely isolated from the remaining interior space of the chamber such that, during a pumping or a venting process, particles dislodged from the interior surface of the chamber wall or from the surface of the chamber components are kept away from the wafers situated in the wafer cassette.

Another advantage made possible by the present invention apparatus is that, instead of a slow pumping or a slow venting process that is carried out in a conventional method which normally takes about 5 min. (to avoid the creation of a turbulent flow in the chamber interior), the present invention apparatus allows rapid pumping or rapid venting of the chamber interior and thus significantly reduces cycle time for either of the processes. This is made possible by shielding the wafers from loose particles caused by a turbulent flow generated in the chamber interior during a rapid pumping or venting process.

The present invention further discloses a method for preventing particle contamination in a wafer transfer chamber when the chamber is equipped with a particle filter. In the method, a wafer cassette is first positioned on a platform of a cassette elevator with the elevator positioned at a lowermost position and the chamber cavity at atmospheric pressure. The elevator is then raised to an uppermost position such that the wafer cassette carried on the platform of the elevator is completely enclosed by the particle filter with a top surface of the platform sealingly engaging a bottom surface of the particle filter. The chamber cavity can then be pumped to a pressure lower than the atmospheric pressure, i.e. to a pressure as low as 100 mTorr. The wafers are then transferred from the wafer cassette by a robot blade into a process chamber for various chemical or physical processing conducted on the wafer surface. After all the wafers are processed and transported back into the wafer cassette, the wafer cassette is again positioned inside the particle filter by raising the elevator to its uppermost position. The chamber cavity is then vented to atmospheric pressure and the wafer cassette is lowered by the cassette elevator to its lowermost position for unloading the wafer cassette.

Referring now to FIG. 5, wherein a simplified cross-sectional view of a present invention load-lock chamber is shown. It should be noted that chamber components other than the elevator means, the particle filter and the pump are not shown for simplicity reason. The present invention load-lock chamber 40 has a chamber enclosure 42 which is constructed of a top wall 44, a bottom wall 46, four sidewalls 48 and an access door, or access port 47, forming a vacuum tight cavity 50 therein. On the bottom wall 46, a pumping means 52 is provided for pumping the cavity 50 to a pressure less than atmospheric pressure, or to a pressure lower than 100 mTorr.

As shown in FIG. 5, a cassette elevator 54 which has a platform 56 with a top surface 58 is provided. On the top surface 58, a wafer cassette 60 is positioned which has a plurality of wafers 70 stored therein. The wafer cassette has a standard dimension of 25 cm wide, 25 cm deep and 30 cm height. As shown in FIG. 5, the cassette elevator 54 is positioned at a lowermost position inside the chamber cavity 50 which is the position for the elevator 50 to load a wafer cassette 60 thereon through an access door (not shown) provided in one of the sidewalls 48.

In the present invention apparatus, particle filter 80 (also shown in an enlarged view in FIG. 7) is stationarily fastened to the top wall 44 of the chamber enclosure 42. The particle filter 80 has a dimension of 30 cm×30 cm×40 cm (height). The fastening means can be suitably a mechanical means or an adhesive means. The particle filter 80 is constructed of a top panel 82 and four side panels 84 with the bottom open. The four side panel 84 forms an enclosure with a cavity 86 therein and a bottom periphery surface 88.

The top panel and the side panels are assembled together by either mechanical means or by adhesive means of a filter material such as one made of polymeric fibers. A suitable filter material used is one that filters out all particles having diameters larger than 0.2 µm, or preferably particles larger than 0.125 µm. Since the smallest particle that is detectable by a surface scan instrument (such as one supplied by KLA Corp.) is about 0.2 µm, the present invention particle filter that is capable of filtering out particles larger than 0.2 µm is sufficient for use in the present semiconductor fabrication technology.

The cassette elevator 54 may further be equipped with a gasket member, or an O-ring 62, as shown in FIG. 7. The gasket 62 may be positioned on the top surface 58 of the cassette elevator platform 56 along a periphery of the platform for sealingly engaging the bottom periphery 88 of the particle filter 80 when the cassette elevator 54 is elevated to its uppermost position, as shown in FIG. 6.

When the cassette elevator 54 is loaded with the wafer cassette 60 and raised to its uppermost position, as shown in FIG. 6, the pumping process or the evacuation of the chamber interior 50 can be started. The pumping process can be rapidly executed even when a turbulent flow of air is produced inside the cavity 50. This is only possible by using the present invention novel particle filter 80 to shield the wafer cassette 60 from the turbulent flow occurred in the cavity 50. Any contaminating particles that have been stirred-up and flown in the cavity 50 are prevented from contaminating the wafers 70 positioned in the wafer cassette 60 during such pumping process since the cassette 60 is completely shielded or isolated from the chamber cavity 50.

After the chamber cavity 50 is evacuated, i.e. to a pressure not higher than 100 mTorr, the cassette elevator 54 descends to its lowermost position (as shown in FIG. 5) such that a robot blade situated in the load-lock chamber can be used to transfer wafer 70 to various process chambers (not shown).

After all the wafers have been processed, the elevator 54 is again elevated to its uppermost position, as shown in FIG. 6, while the chamber cavity 50 is rapidly vented to atmospheric pressure. After the chamber cavity 50 reaches atmospheric pressure, the access door (not shown) through the sidewall 48 may be opened to unload the wafer cassette 60 from the load-lock chamber 40.

The present invention novel particle filter 80 not only allows a significant reduction in particle contamination on wafers carried in a wafer cassette in the load-lock chamber, but also allows a more rapid pumping and venting process to be carried out in the load-lock chamber without causing severe particle contamination on the wafers. The present invention method and apparatus therefore achieve two major benefits of not only reducing particle contamination, but also reducing fabrication time required for semiconductor devices.

The present invention method and apparatus have therefore been amply described in the above description and in the appended drawings of FIGS. 5, 6 and 7.

While the present invention has been described in an illustrative manner, it should be understood that the terminology used is intended to be in a nature of words of description rather than of limitation.

Furthermore, while the present invention has been described in terms of a preferred embodiment, it is to be appreciated that those skilled in the art will readily apply these teachings to other possible variations of the inventions.

The embodiment of the invention in which an exclusive property or privilege is claimed are defined as follows.

What is claimed is:

1. A wafer transfer chamber having reduced particle contamination problem comprising:
   a chamber enclosure having a top wall, a bottom wall and four sidewalls forming vacuum tight cavity therein;
   a pumping means for evacuating said cavity to a pressure smaller than atmospheric pressure;
   a venting means for venting said cavity to atmospheric pressure;
   an elevator means having a platform for holding a wafer cassette thereon and for moving upwardly or downwardly into a pumping/venting or unloading position; and
   a particle filter means having a top panel and four side panels fabricated of a material for filtering out particles, said top panel being stationarily fastened to an interior surface of said top wall of the chamber enclosure while said four side panels forms an enclosure sealingly engaging a top surface of said platform when said platform being raised to an uppermost position by said elevator mean during either a pumping or a venting operation.

2. A wafer transfer chamber having reduced particle contamination problem according to claim 1, wherein said wafer transfer chamber is a load-lock chamber for a semiconductor processing tool.

3. A wafer transfer chamber having reduced particle contamination problem according to claim 1 further comprising a pumping means for evacuating said cavity to a pressure smaller than 100 mTorr.

4. A wafer transfer chamber having reduced particle contamination problem according to claim 1, wherein said chamber enclosure further comprises an access door through one of said four sidewalls for transporting into/out of said chamber enclosure a wafer cassette.

5. A wafer transfer chamber having reduced particle contamination problem according to claim 1, wherein said particle filter means having a top panel and four side panels fabricated of a material for filtering out particles larger than 0.2 µm diameter.

6. A wafer transfer chamber having reduced particle contamination problem according to claim 1, wherein said particle filter means having a top panel and four side panels fabricated of a material for filtering out particles larger than 0.125 µm diameter.

7. A wafer transfer chamber having reduced particle contamination problem according to claim 1, wherein said platform further comprises a gasket member positioned on top of said platform along a peripheral edge for sealingly engaging a bottom end of said four side panels of the particle filter means.

8. A wafer transfer chamber having reduced particle contamination problem according to claim 1, wherein said top panel and said four side panels of the particle filter means being formed of a material fabricated of polymeric fibers.

9. A method for preventing particle contamination in a wafer transfer chamber comprising the steps of:

providing a chamber enclosure having a top wall, a bottom wall and four sidewall forming a vacuum tight cavity therein, a pumping means and a venting means for evacuating and venting said chamber cavity, an elevator means for holding a wafer cassette thereon and for moving upwardly or downwardly into a pumping/venting or unloading position and a particle filter means having a top panel and four side panels fabricated of a material for filtering out particles wherein said top panel being stationarily fastened to an interior surface of said top wall of the chamber enclosure;

positioning a wafer cassette on a platform of said elevator means, while said elevator means being positioned at a lowermost position and said chamber cavity at atmospheric pressure;

elevating said elevator means to an uppermost position such that a top surface of said platform sealingly engages a bottom surface of said four side panels with said wafer cassette enclosed by said particle filter means;

pumping said chamber cavity to a pressure smaller than atmospheric pressure;

transferring wafers from said wafer cassette into a process chamber by a wafer transfer robot until all wafers are processed;

venting the chamber cavity to atmospheric pressure with said elevator means in said uppermost position and said wafer cassette enclosed in said particle filter means; and lowering said elevator means to a lowermost position for unloading said wafer cassette.

10. A method for reducing particle contamination in a wafer transfer chamber according to claim 9 further comprising the step of pumping said chamber cavity to a pressure of smaller than 100 mtorr.

11. A method for reducing particle contamination in a wafer transfer chamber according to claim 9 further comprising the step of filtering out particles having a diameter larger than 0.2 µm by said particle filter means when said wafer cassette being enclosed by said particle filter means during said pumping step and said venting step.

12. A method for reducing particle contamination in a wafer transfer chamber according to claim 9 further comprising the step of filtering out particles having a diameter larger than 0.125 µm by said particle filter means when said wafer cassette is enclosed by said particle filter means during said pumping and said venting step.

13. A method for reducing particle contamination in a wafer transfer chamber according to claim 9 further comprising the step of mounting said wafer transfer chamber to a semiconductor cluster tool.

14. A method for reducing particle contamination in a wafer transfer chamber according to claim 9 further comprising the step of transporting a wafer cassette into said chamber cavity through an access port provided in one of said four sidewalls of the chamber enclosure.

15. A method for reducing particle contamination in a wafer transfer chamber according to claim 9 further comprising the step of fabricating said particle filter means with a material formed of polymeric fibers.

16. A method for reducing particle contamination in a wafer transfer chamber according to claim 9 further comprising the step of transporting out of said chamber enclosure a wafer cassette after all wafers have been processed through an access door in one of said four sidewalls of said chamber enclosure.

17. A method for reducing particle contamination in a wafer transfer chamber according to claim 9 further comprising the step of providing a gasket member on a top surface of said platform for sealingly engaging a bottom surface of said four side panels of the particle filter means when said elevator means being moved into said uppermost position engaging said particle filter means.

18. A method for reducing particle contamination in a wafer transfer chamber according to claim 9 further comprising the step of mounting said pumping means for evacuating said cavity through said bottom wall of the chamber enclosure.

19. A method for reducing particle contamination in a wafer transfer chamber according to claim 9 further comprising the step of pumping said chamber cavity by said pumping means for a time period of at least 3 min.

20. A method for reducing particle contamination in a wafer transfer chamber according to claim 9 further comprising the step of venting said chamber cavity to atmospheric pressure for a time period of at least 3 min.

* * * * *